United States Patent [19]
Ito et al.

[11] Patent Number: 5,852,784
[45] Date of Patent: Dec. 22, 1998

[54] MULTIBAND MOBILE UNIT COMMUNICATION APPARATUS

[75] Inventors: Fumio Ito; Seiichi Yamaguchi; Fujio Sasaki, all of Yokohama; Hiroaki Kosugi, Osaka, all of Japan

[73] Assignee: Matsushita Electric Industrial Co., Ltd., Osaka, Japan

[21] Appl. No.: 813,117

[22] Filed: Mar. 7, 1997

[30] Foreign Application Priority Data

Apr. 8, 1996 [JP] Japan ..................... 8-110570

[51] Int. Cl.⁶ ..................... H04B 1/40
[52] U.S. Cl. ............ 455/552; 455/143; 455/209; 455/314
[58] Field of Search ............ 455/552, 553, 455/143, 6.1, 132, 133, 303, 314, 76, 75, 131, 180.1, 189.1, 141, 146, 207, 209, 324, 180.2, 188.2, 257, 266; 370/481, 482, 483, 206; 375/328

[56] References Cited

U.S. PATENT DOCUMENTS

| | | | |
|---|---|---|---|
| 5,239,697 | 8/1993 | Kosuga ..................... | 455/133 |
| 5,280,636 | 1/1994 | Kelley et al. ............... | 455/131 |
| 5,437,051 | 7/1995 | Oto . | |
| 5,590,174 | 12/1996 | Tsuji et al. ................. | 455/553 |

FOREIGN PATENT DOCUMENTS 7303059  11/1995  Japan .

*Primary Examiner*—Wellington Chin
*Assistant Examiner*—Lee Nguyen
*Attorney, Agent, or Firm*—Pollock, Vande Sande & Amernick

[57] ABSTRACT

A multiband mobile unit communication apparatus is disclosed which comprises: an antenna for receiving 1st and 2nd bands of radio wave SIGs including quadrature modulation SIGs; a 1st LO CKT for generating a 1st LO SIG; 1st and 2nd receiving CKTs for generating 1st and 2nd IF SIGs from the 1st and 2nd bands of radio wave SIGs using the 1st LO SIG respectively; a switching CKT responsive to a switching control SIG indicative of 1st and 2nd modes for outputting the 1st IF SIG in the 1st mode and outputting the 2nd IF SIG in the 2nd mode; a 2nd LO CKT for generating 2nd and 3rd LO SIGs in the 1st and 2nd modes respectively; and a quadrature demodulation CKT for demodulating and outputting quadrature SIGs from an output from the switching CKT using the 2nd and third LO SIGs in the 1st and 2nd modes respectively. The 2nd LO CKT comprises: a local oscillator for generating a 4th LO SIG, a FRQ divider for dividing the 4th LO SIG with a given divisor and generating the 2nd LO SIG; and a switch for outputting the 2nd LO SIG in the 1st mode and outputting the 4th LO SIG as the 3rd LO SIG in the 2nd mode in response to the switching control SIG. The given divisor corresponds to a ratio between center FRQs of the 1st and 2nd IF SIGs. The 2nd LO CKT may change the LO FRQ by switchably connecting resonating elements to an oscillator.

12 Claims, 4 Drawing Sheets

5,852,784

MULTIBAND MOBILE UNIT COMMUNICATION APPARATUS

BACKGROUND OF THE INVENTION

1. Field of the Invention

This invention relates to a multiband mobile unit communication apparatus.

2. Description of the Prior Art

A mobile unit communication apparatus for communicating with a third party through a base station and a network is known.

FIG. 4 is a block diagram of a prior art mobile unit communication apparatus for transmitting and receiving a radio wave communication signal of a single band.

This prior art mobile unit communication apparatus comprises an antenna 101 for transmitting and receiving a radio wave communication signal of a single band which is subjected to the quadrature modulation, a duplexer 102 for simultaneously transmitting and receiving, a low noise amplifier 104 for amplifying the received radio wave communication signal, a mixer 106 for mixing the received radio wave communication signal with a local oscillation signal from a local oscillator 110 to provide an intermediate frequency signal, a filter 108 for filtering the intermediate frequency signal, a variable gain amplifier 112 for amplifying the intermediate frequency signal with its gain controlled, a quadrature demodulator 113 for mixing the received communication signal from the variable gain amplifier 112 with a local oscillation signal and ½ π -phase shifted local oscillation signal which are derived from a local oscillator 118 through a ½-divider, and low-pass filters 114 and 115 for outputting an I signal and a Q signal at output terminals 116 and 117.

The antenna 101 transmits and receives a radio wave communication signal of a single band. The duplexer 102 effects transmission and receiving simultaneously. The low noise amplifier 104 amplifies the received radio wave communication signal. The mixer 106 mixes the received radio wave communication signal with the local oscillation signal from the local oscillator 110 to provide the intermediate frequency signal. The filter 108 filters the intermediate frequency signal. The variable gain amplifier 112 amplifies the intermediate frequency signal with its gain controlled. The quadrature demodulator 113 mixes the received communication signal from the variable gain amplifier 112 with the local oscillation signal and ½ π -phase shifted local oscillation signal to provide I and Q signals respectively. The low-pass filters 114 and 115 output the I and Q signals at the output terminals 116 and 117.

SUMMARY OF THE INVENTION

The aim of the present invention is to provide an improved multiband mobile unit communication apparatus.

According to the present invention, a first multiband mobile unit communication apparatus is provided which comprises: an antenna for receiving multiple frequency bands of radio wave signals; a first local oscillation circuit for generating a first local oscillation signal corresponding to the multiple frequency bands of radio wave signals; receiving circuits corresponding to the multiple frequency bands of radio wave signals for generating intermediate frequency signals corresponding to the multiple frequency bands by mixing the multiple frequency bands of radio wave signals with the first local oscillation signal corresponding to the multiple frequency bands respectively; a switching circuit responsive to a switching control signal indicative of which frequency bands the mobile unit is operating for outputting one of the intermediate frequency signals according to the mobile communication system using different frequency bands of radio wave signals; a second local oscillation circuit for generating the second local oscillation signals corresponding to the multiple frequency bands and for switching the output from the second local oscillation circuit responsive to the switching control signal; and a quadrature demodulation circuit for demodulating and outputting baseband signals by mixing an output from the switching circuit with the second local oscillation signals that is switched by the switching control signal.

In the first multiband mobile unit communication apparatus, the second local oscillation circuit comprises: a local oscillator for generating a second local oscillation signal, a frequency divider having a predetermined divisor for frequency-dividing the second local oscillation signal; and a switch responsive to the switching control signal for outputting the second local oscillation signal or for outputting the frequency-dividing second local oscillation signal in response to the switching control signal. In this case, the predetermined divisor corresponds to a ratio between center frequencies of the intermediate frequency signals corresponding to the multiple frequency bands.

In the first multiband mobile unit communication apparatus, the first local oscillation circuit may generate the first local oscillation signal having a predetermined local oscillation frequency.

In the first multiband mobile unit communication apparatus, the first local oscillation circuit may include a voltage controlled oscillator, may be responsive to the switching control signal, and may generate multiple the first local oscillation signals having different frequencies corresponding to the multiple frequency bands of radio wave signals by adjusting the control voltage of the voltage controlled oscillator using the first local oscillation circuit.

In the first multiband mobile unit communication apparatus, the first local oscillation circuit may be responsive to the switching control signal and generate the first local oscillation signal having a first local oscillation frequency or generate a frequency-divided first local oscillation frequency according to the switching control signal.

In the first multiband mobile unit communication apparatus, the second local oscillation circuit may comprise: an oscillator, a switch that is responsive to the switching control signal, multiple resonators having different resonating frequencies, wherein the switch connects the oscillator to one of the multiple resonators, thereby generating one of the second local oscillation signal and connects the oscillator to other the multiple resonators, thereby generating other the second local oscillation signal corresponding to the multiple frequency bands. In this case, a ratio of frequencies between the second local oscillation signals corresponds to a ratio between center frequencies of the intermediate frequency signals corresponding to the multiple frequency bands.

In the first multiband mobile unit communication apparatus, the first local oscillation circuit is responsive to the switching control signal and generates multiple the first local oscillation signals having different frequencies corresponding to the multiple frequency bands of radio wave signals by switching multiple resonators having different resonating frequencies that is connected to the first local oscillation circuit.

According to the present invention, a second multiband mobile unit communication apparatus is provided which comprises: an antenna for receiving first and second bands of radio wave signals including quadrature modulation signals; a first local oscillation circuit for generating a first local oscillation signal; first and second receiving circuits for generating first and second intermediate frequency signals from the first and second bands of radio wave signals using the first local oscillation signal respectively; a switching circuit responsive to a switching control signal indicative of first and second modes for outputting the first intermediate frequency signal in the first mode and outputting the second intermediate frequency signal in the second mode; a second local oscillation circuit for generating second and third local oscillation signals in the first and second modes respectively; and a quadrature demodulation circuit for demodulating an output from the switching circuit using the second and third local oscillation signals in the first and second modes respectively and outputting demodulated signals.

In the second multiband mobile unit communication apparatus, a ratio of frequencies between the second and third oscillation signals corresponds to a ratio between center frequencies of the first and second intermediate frequency signals.

In the second multiband mobile unit communication apparatus, the second local oscillation circuit may comprise: an oscillator, a switch, first and second resonators having different resonating frequencies, wherein the switch connects the oscillator to the first resonator, thereby generating the second local oscillation signal in the first mode and connects the oscillator to the second resonator, thereby generating the third local oscillation signal in the second mode.

BRIEF DESCRIPTION OF THE DRAWINGS

The object and features of the present invention will become more readily apparent from the following detailed description taken in conjunction with the accompanying drawings in which.

The same or corresponding elements or parts are designated with like references throughout the drawings.

DETAILED DESCRIPTION OF THE INVENTION

Hereinbelow will be described a first embodiment of this invention.

Figure 1:
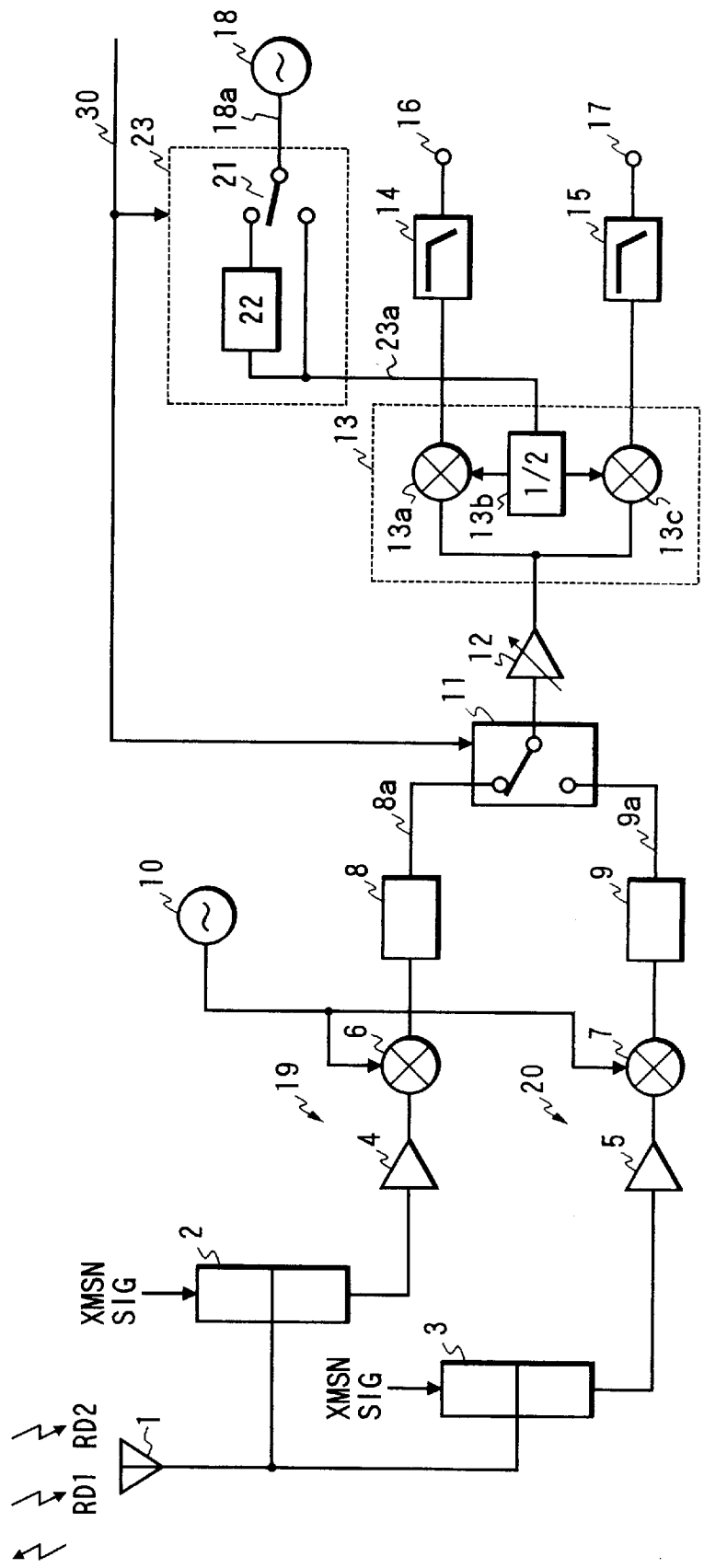
FIG. 1 is a block diagram of a multiband mobile unit communication apparatus of a first embodiment.

FIG. 1 is a block diagram of a multiband mobile unit communication apparatus of the first embodiment.

The multiband mobile unit communication apparatus of the first embodiment can be operated in multiple mobile communication systems A and B and it comprises an antenna 1 for transmitting and receiving at least first and second bands of radio wave signals RD1 and RD2 including quadrature modulated signals respectively, a first local oscillator 10 comprising a voltage controlled oscillator for generating a first local oscillation signal, first and second receiving circuits 19 and 20 corresponding to the mobile communication systems A and B respectively for amplifying the received radio wave signals and generating intermediate frequency signals 8a and 9a corresponding to the mobile communication systems A and B respectively, an intermediate frequency switch 11 responsive to a switching control signal 30 indicative of which radio frequency bands the mobile unit is operating for outputting the first intermediate frequency signal 8a corresponding to the mobile communication system A and outputting the second intermediate frequency signal 9a corresponding to the mobile communication system B, a second local oscillator 18 including a VCO (voltage controlled oscillator) for generating a second local oscillation signal, a frequency divider 22 for frequency-dividing the second local oscillation signal with a predetermined divisor, a radio frequency switch 21 responsive to the switching control signal 30, a quadrature demodulation circuit 13 for demodulating and outputting baseband I and Q signals by mixing an output from the intermediate frequency switch 11 with a reference frequency signal 23a, wherein the radio frequency switch 21 supplies an output of the frequency divider 22 as the reference frequency signal in the mobile communication system A and supplies the second local oscillation signal as the reference frequency signal in the mobile communication system B (in the second mode).

A variable gain amplifier 12 is also provided between the intermediate frequency switch 11 and the quadrature demodulation circuit 13.

The first receiving circuit 19 corresponding to the mobile communication system A comprises a duplexer 2 for duplexing a transmission signal and the received radio wave signal RD1, a low noise amplifier 4 for amplifying the received radio wave signal RD1 from the duplexer 2, a mixer 6 for mixing an output of the low noise amplifier 4 with the first local oscillation signal, a band bass filter 8 for selectively outputting the desired intermediate frequency signal 8a corresponding to the first radio wave signal RD1 from the output of the mixer 6.

The second receiving circuit 20 corresponding to the mobile communication system B comprises a duplexer 3 for duplexing a transmission signal and the received radio wave signal RD2, a low noise amplifier 5 for amplifying the received radio wave signal RD2 from the duplexer 3, a mixer 7 for mixing an output of the low noise amplifier 5 with the first local oscillation signal, a band bass filter 9 for selectively outputting the desired intermediate frequency signal 9a corresponding to the second radio wave signal RD2 from the output of the mixer 7.

The quadrature demodulation circuit 13 comprises a mixer 13a for mixing an output of the variable gain amplifier 12 with a reference signal 23a through a ½-dividing circuit 13b, the ½-dividing circuit 13b for generating ½-divided oscillation signal for I channel and a ½ π -phase-shifted and ½-divided oscillation signal for Q channel, a mixer 13c for mixing the output of the variable gain amplifier 12 with ½-phase-shifted and ½-divided oscillation signal from ½-divider 13b.

The antenna 1 receives at least first and second bands of radio wave signals RD1 and RD2 including quadrature modulated signals. The first local oscillator 10 generates the first local oscillation signal having the first local oscillation frequency. The first and second receiving circuits 19 and 20 generate the first and second intermediate frequency signals 8a and 9a corresponding to the mobile communication systems A and B respectively from the first and second bands of radio wave signals RD1 and RD2 using the first local oscillation signal. The intermediate frequency switch 11 responsive to the switching control signal 30 outputs the intermediate frequency signal 8a in the mobile communication system A (in a first mode) and the intermediate frequency signal 9a in the mobile communication system B (in a second mode).

The second local oscillator 18 generates the second local oscillation signal having a second local oscillation frequency corresponding to a frequency of the second intermediate frequency signal 9a. The frequency divider 22 frequency-divides the second local oscillation signal 18a with the predetermined divisor. More specifically, the ratio of center frequencies of the intermediate frequency signals 8a and 9a corresponds to the reciprocal of the divisor of the frequency divider 22. The radio frequency switch 21 responsive to the switching control signal 30 supplies an output of the frequency divider 22 in the mobile communication system A as the reference signal and outputs the second local oscillation signal 18a as the reference signal in the mobile communication system B.

The quadrature demodulation circuit 13 demodulates and outputs the baseband signals I and Q by mixing an output from the intermediate frequency switch 11 with a reference frequency signal 23a through the ½-divider 13b.

In the mobile communication system A, the intermediate frequency signal 8a from the received first radio wave signal RD1 is outputted by the intermediate frequency switch 11 and is subject to the quadrature demodulation by the quadrature demodulation circuit 13 using the reference frequency signal 23a from the second local oscillator 18 through the ½-frequency divider 22.

In the mobile communication system B, the intermediate frequency signal 9a from the received second radio wave signal RD2 is outputted by the intermediate frequency switch 11 and is subject to the quadrature demodulation by the quadrature demodulation circuit 13 using the reference signal directly derived from the second local oscillator 18. In this embodiment, the local oscillation frequency of the first local oscillator is fixed, or even if the local oscillation frequency should be changed according to multiple radio frequency bands, single VCO can cover the multiple local oscillation frequency by adjusting the control voltage of the VCO.

The radio frequency switch 21 is provided at the input side of the frequency divider 22. However, this switch may be provided at the output side of the frequency divider 22 or provided at the both sides of the frequency divider 22. In this embodiment, because the output of the frequency divider 22 is designed to have an impedance larger than an output impedance of the second local oscillator 18, the radio frequency switch can be provided at the input side of the frequency divider.

In this embodiment, an integer relation of frequencies between the intermediate frequency signals 8a and 9a corresponding to the mobile unit communication systems A and B respectively is provided, so that the local oscillator 18 can be commonly used in both of the mobile communication systems A and B using the frequency divider 22.

As mentioned, the antenna 1 receives at least first and second bands of radio wave signals RD1 and RD2 including quadrature modulated signals. The first local oscillator 10 generates the first local oscillation signal having the first local oscillation frequency. The first and second receiving circuits 19 and 20 generate the intermediate frequency signals 8a and 9a from the first and second bands of radio wave signals RD1 and RD2 using the first local oscillation signal. The intermediate frequency switch 11 responsive to the switching control signal 30 outputs the intermediate frequency signal 8a in the first mode and intermediate frequency signal 9a in the second mode.

The second local oscillator 18 generates the second local oscillation signal having a second local oscillation frequency corresponding to a frequency of the intermediate frequency signal 9a. The frequency divider 22 frequency-divides the second local oscillation signal 18a with the predetermined divisor. More specifically, the ratio of center frequencies of the intermediate frequency signals 8a and 9a corresponds to the reciprocal of the divisor of the frequency divider 22. The second switch 21 responsive to the switching control signal 30 outputs an output of the frequency divider 22 in the first mode as the reference signal 23a and outputs the second local oscillation signal 18a as the reference signal 23a in the second mode.

The quadrature demodulation circuit 13 demodulates the output from the intermediate frequency switch 11 and outputs the quadrature baseband signals I and Q from an output from the intermediate frequency switch 11 using the reference frequency signal 23a.

In the first mode, the intermediate frequency signal 8a from the received first radio wave signal is outputted by the intermediate frequency switch 11 and is subject to the quadrature demodulation by the quadrature demodulation circuit 13 using the reference frequency signal 23a from the second local oscillator 18 through the frequency divider 22.

In the second mode, the intermediate frequency signal 9a from the received second radio wave signal RD2 is outputted by the intermediate frequency switch 11 and is subject to the quadrature demodulation by the quadrature demodulation circuit 13 using the reference signal directly derived from the second local oscillator 18. In this embodiment, the local oscillation frequency of the first local oscillator is fixed.

As mentioned, a ratio of frequencies between the second and third oscillation signals corresponds to a ratio between center frequencies of the first and second intermediate frequency signals, that is, there is provided an integer relation between center frequencies of the first and second intermediate frequency signals.

Figure 2:
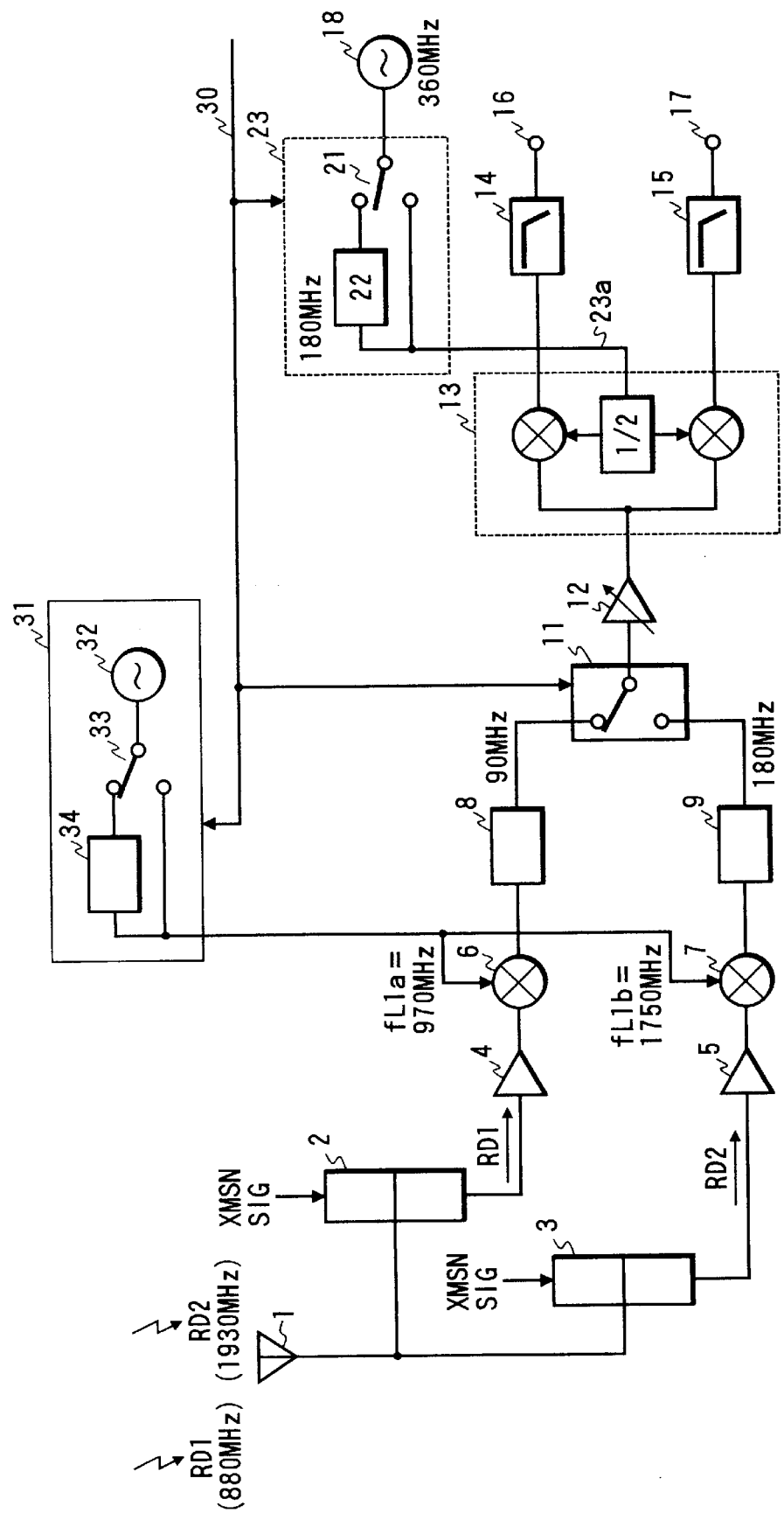
FIG. 2 is a block diagram of a multiband mobile unit communication apparatus of a second embodiment.

A second embodiment will be described. FIG. 2 is a block diagram of a multiband mobile unit communication apparatus of the second embodiment.

The multiband mobile unit communication apparatus of the second embodiment has substantially the same structure as that of the first embodiment. The difference is that the local oscillation circuit 31 replaces the local oscillator 10 in FIG. 1.

The local oscillator 31 generates a local oscillation signal fL1a corresponding to the mobile communication system A (in the first mode) and a local oscillation signal fL1b corresponding to the mobile communication system B (in the second mode).

In this embodiment, it is assumed that a center frequency of the radio wave signal RD1 corresponding to the mobile communication system A is 880 MHz, a center frequency of the radio wave signal RD2 corresponding to the mobile communication system B is 1930 MHz. Then, the local oscillator 31 generates the local oscillation signal having a local oscillation frequency of 970 MHz to receive the radio wave signal RD1 in the mobile communication system A and a local oscillation signal having a local oscillation frequency 1750 MHz to receive the radio wave signal RD2 in the mobile communication system B. Then, the intermediate frequency fIF in the mobile communication system A is 90 MHz, that is, the band pass filter 8 has a center frequency of 90 MHz of its passband and the intermediate frequency fIF in the mobile communication system B is 180 MHz, that is, the band pass filter 9 has a center frequency of 180 MHz of its passband. In this condition, the divisor of a frequency divider 34 can be set to two.

The reference frequency signal generation circuit 23 generates the reference frequency signal having 180 MHz in the mobile communication system A and 360 MHz in the mobile communication system B. The quadrature signal demodulation circuit 13 effects the quadrature demodulation using the quadrature reference signal of 90 MHz by dividing the reference signal of 180 MHz from the reference signal generation circuit 23 by two in the mobile communication system A and using a quadrature reference signal 180 MHz by dividing the 360 MHz from the second local oscillator 18 via the reference signal generation circuit 23 by two in the mobile communication system B.

Table 1 shows this frequency relation in respective points of the multiband mobile unit communication apparatus of the second embodiment.

TABLE 1

|  | RADIO WAVE | fL1 (MHz) | fIF (MHz) | fL2 (MHz) | fVCO (MHz) |
|---|---|---|---|---|---|
| MOBILE COM SYS A | RD1 880 MHz | 970 | 90 | 180 | 360 |
| MOBILE COM SYS B | RD2 1930 MHz | 1750 | 180 | 360 | 360 |

In this embodiment, if it is impossible to provide an accurate integer relation between the first and second intermediate frequency signals corresponding to the mobile communication systems A and B respectively, the quadrature demodulation using the frequency divider 22 can be provided by making the frequency relation slightly deviating from the integer relation and by adjusting a voltage control signal to the voltage-controlled oscillator 18.

A third embodiment will be described.

Figure 3:
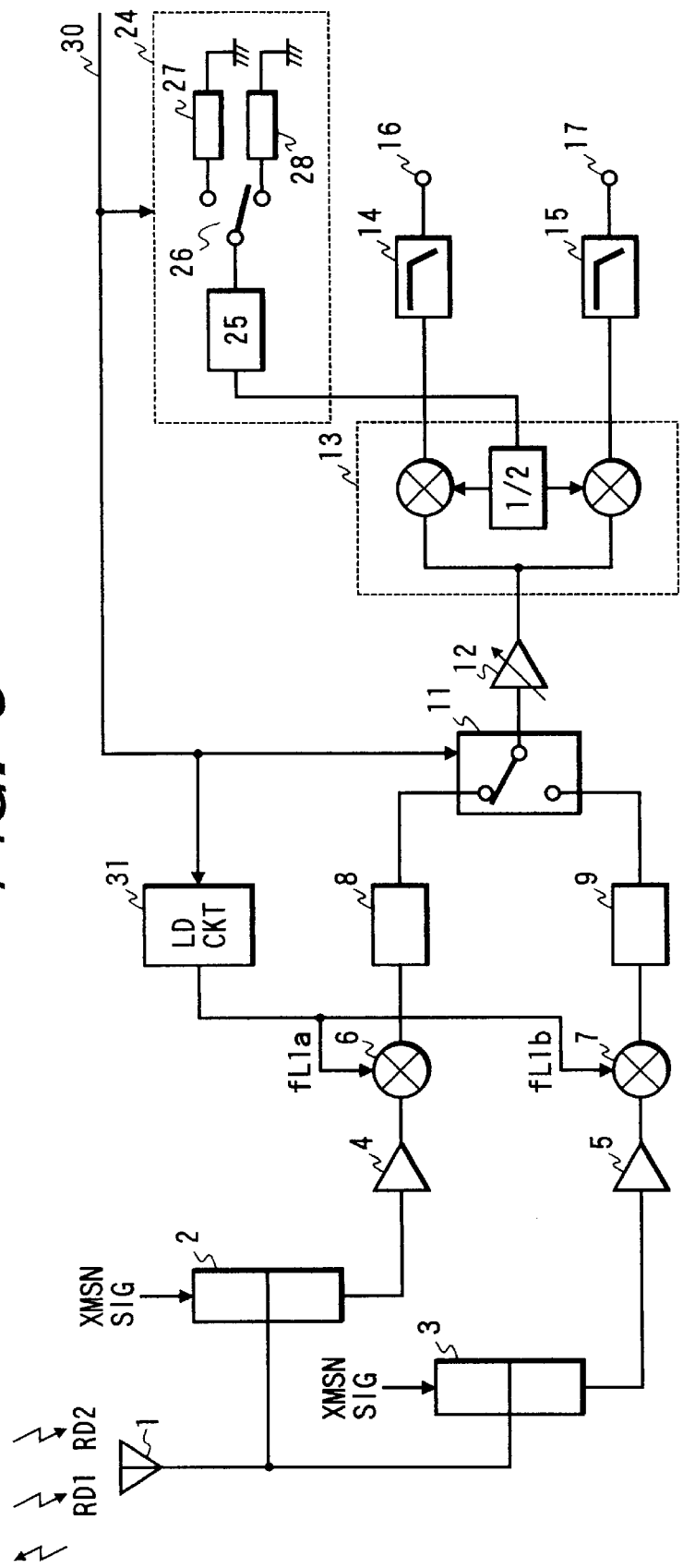
FIG. 3 is a block diagram of a multiband mobile unit communication apparatus of a third embodiment.
Figure 4:
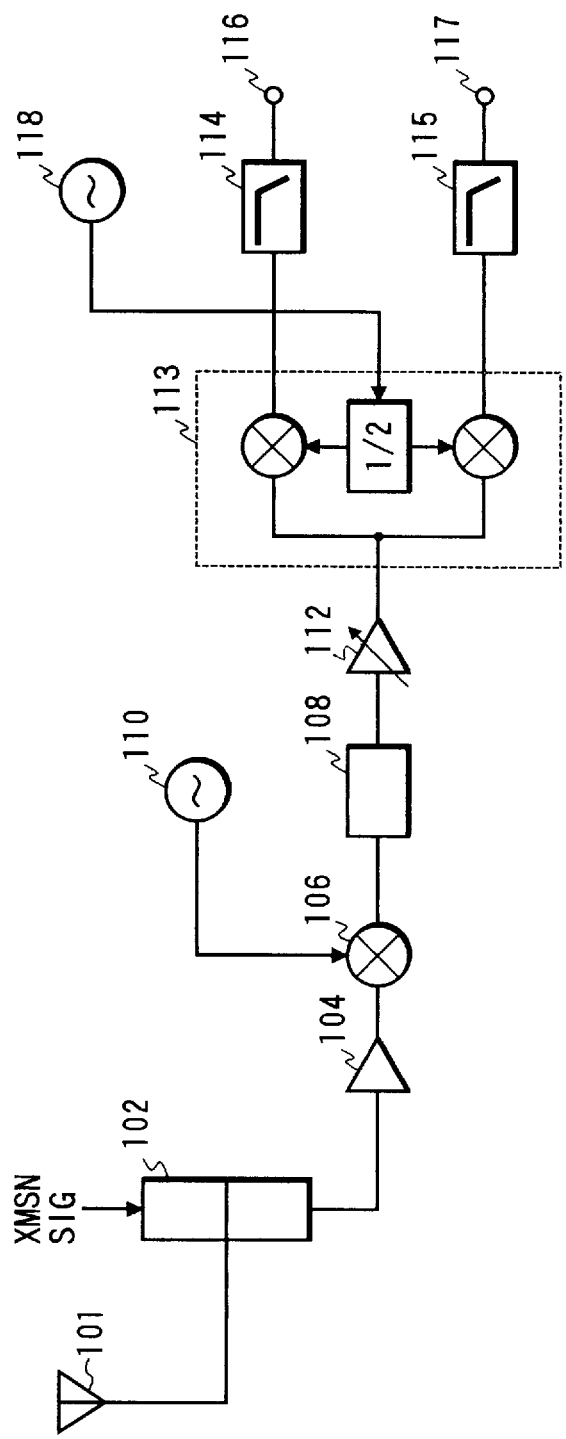
FIG. 4 is a block diagram of a prior art mobile unit communication apparatus for transmitting and receiving a radio wave communication signal of a single band.

FIG. 3 is a block diagram of a multiband mobile unit communication apparatus of the third embodiment.

The multiband mobile unit communication apparatus of the third embodiment has substantially the same structure as that of the second embodiment. The difference is that the local oscillation circuit 24 replaces the local oscillation circuit 23 in FIG. 2.

The local oscillation circuit 24 comprises an oscillator 25, a switch 26, first and second resonators 27 and 28 having different resonance frequencies. The switch 26 connects or couples the oscillator 25 to the first resonator 27, thereby generating the local oscillation signal of 180 MHz in the mobile communication system A (in the first mode) and connects or couples the oscillator 25 to the second resonator 28, thereby generating the local oscillation signal of 360 MHz in the mobile communication system B (in the second mode). In the third embodiment, it is unnecessary to provide the integer relation between the intermediate frequency signals corresponding to the mobile communication systems A and B used in selecting or deciding the first and second embodiments, so that a degree of freedom in the frequency relation between the intermediate frequency signals 8a and 9a has become larger.

As mentioned, the switch 26 connects or couples the oscillator 25 to the first resonator 27, thereby generating the local oscillation signal of 180 MHz in the first mode and connects or couples the oscillator 25 to the second resonator 28, thereby generating the local oscillation signal of 360 MHz in the second mode.

In the third embodiment, the first local oscillation circuit 31 changes the local oscillation frequency according to the multiple mobile communication systems. However, it is also possible to fix the first local oscillation frequency signal supplied to the first and second receiving circuits corresponding to the multiple communication systems as shown in FIG. 1.

What is claimed is:

1. A multiband mobile unit communication apparatus comprising:
   an antenna for receiving multiple frequency bands of radio wave signals;
   a first local oscillation circuit for generating a first local oscillation signal corresponding to said multiple frequency bands of radio wave signals;
   receiving circuits corresponding to said multiple frequency bands of radio wave signals for generating intermediate frequency signals corresponding to said multiple frequency bands by mixing said multiple frequency bands of radio wave signals with said first local oscillation signal corresponding to said multiple frequency bands respectively;
   switching means responsive to a switching control signal indicative of which frequency bands the mobile unit is operating for outputting one of said intermediate frequency signals according to the mobile communication system using different frequency bands of radio wave signals;
   a second local oscillation circuit for generating the second local oscillation signals corresponding to said multiple frequency bands and for switching the output from said second local oscillation circuit responsive to said switching control signal; and
   a quadrature demodulation means for demodulating and outputting baseband signals by mixing an output from said switching means with said second local oscillation signals that is switched by said switching control signal.

2. A multiband mobile unit communication apparatus as claimed in claim 1, wherein said second local oscillation circuit comprises: a local oscillator for generating a second local oscillation signal, a frequency divider having a predetermined divisor for frequency-dividing said second local oscillation signal; and a switch responsive to said switching control signal for outputting said second local oscillation signal or for outputting said frequency-dividing second local oscillation signal in response to said switching control signal.

3. A multiband mobile unit communication apparatus as claimed in claim 2, wherein said predetermined divisor corresponds to a ratio between center frequencies of said intermediate frequency signals corresponding to said multiple frequency bands.

4. A multiband mobile unit communication apparatus as claimed in claim 1, wherein said first local oscillation circuit generates said first local oscillation signal having a predetermined local oscillation frequency.

5. A multiband mobile unit communication apparatus as claimed in claim 1, wherein said first local oscillation circuit is responsive to said switching control signal and generates multiple first local oscillation signals having different frequencies corresponding to said multiple frequency bands of radio wave signals by adjusting the control voltage of the voltage controlled oscillator using said first local oscillation circuit.

6. A multiband mobile unit communication apparatus as claimed in claim 1, wherein said first local oscillation circuit is responsive to said switching control signal and generates said first local oscillation signal having a first local oscillation frequency or generates a frequency-dividing said first local oscillation frequency according to said switching control signal.

7. A multiband mobile unit communication apparatus as claimed in claim 1, wherein said second local oscillation circuit comprises: an oscillator, a switch that is responsive to said switching control signal, multiple resonators having different resonating frequencies, wherein said switch connects said oscillator to one of said multiple resonators, thereby generating one of said second local oscillation signal and connects said oscillator to other said multiple resonators, thereby generating other said second local oscillation signal corresponding to said multiple frequency bands.

8. A multiband mobile unit communication apparatus as claimed in claim 7, wherein a ratio of frequencies between said second local oscillation signals responsive to said switching control signal corresponds to a ratio between center frequencies of said intermediate frequency signals corresponding to said multiple frequency bands.

9. A multiband mobile unit communication apparatus as claimed in claim 1, wherein said first local oscillation circuit is responsive to said switching control signal and generates multiple first local oscillation signals having different frequencies corresponding to said multiple frequency bands of radio wave signals by switching multiple resonators having different resonating frequencies that is connected to said first local oscillation circuit.

10. A multiband mobile unit communication apparatus comprising:

an antenna for receiving first and second bands of radio wave signals including quadrature modulation signals;

a first local oscillation circuit for generating a first local oscillation signal;

first and second receiving circuits for generating first and second intermediate frequency signals from said first and second bands of radio wave signals using said first local oscillation signal respectively;

switching means responsive to a switching control signal indicative of first and second modes for outputting said first intermediate frequency signal in said first mode and outputting said second intermediate frequency signal in said second mode;

a second local oscillation circuit for generating second and third local oscillation signals in said first and second modes respectively; and quadrature demodulation means for demodulating an output from said switching means using said second and third local oscillation signals in said first and second modes respectively and outputting demodulated signals.

11. A multiband mobile unit communication apparatus as claimed in claim 10, wherein a ratio of frequencies between said second and third oscillation signals corresponds to a ratio between center frequencies of said first and second intermediate frequency signals.

12. A multiband mobile unit communication apparatus as claimed in claim 10, wherein said second local oscillation circuit comprises: an oscillator, a switch, first and second resonators having different resonating frequencies, wherein said switch connects said oscillator to said first resonator, thereby generating said second local oscillation signal in said first mode and connects said oscillator to said second resonator, thereby generating said third local oscillation signal in said second mode.

* * * * *